United States Patent
Peng et al.

(10) Patent No.: US 7,394,164 B2
(45) Date of Patent: Jul. 1, 2008

(54) SEMICONDUCTOR DEVICE HAVING BUMPS IN A SAME ROW FOR STAGGERED PROBING

(75) Inventors: Bing-Yen Peng, Taipei (TW); Ho-Cheng Shih, Taipei (TW)

(73) Assignee: Ultra Chip, Inc., Taipei (TW)

( * ) Notice: Subject to any disclaimer, the term of this patent is extended or adjusted under 35 U.S.C. 154(b) by 10 days.

(21) Appl. No.: 11/494,594

(22) Filed: Jul. 28, 2006

(65) Prior Publication Data
US 2008/0023828 A1   Jan. 31, 2008

(51) Int. Cl.
*H01L 23/48* (2006.01)
(52) U.S. Cl. .............. 257/784; 257/E23.069; 257/E23.02; 257/786; 257/737; 257/775; 257/774; 257/773; 257/780; 257/782; 257/690; 257/691; 257/692; 257/693; 257/48; 257/778
(58) Field of Classification Search ............ 257/784, 257/786, 775, 774, 773, 780, 690, 691, 692, 257/693, 48, 778, E23.069, E23.02, 737
See application file for complete search history.

(56) References Cited

U.S. PATENT DOCUMENTS

| | | | | |
|---|---|---|---|---|
| 5,565,385 | A * | 10/1996 | Rostoker et al. | 438/614 |
| 6,251,768 | B1 * | 6/2001 | Lin | 438/617 |
| 7,064,450 | B1 * | 6/2006 | Eghan et al. | 257/786 |
| 7,075,017 | B2 * | 7/2006 | Nishi et al. | 174/261 |
| 7,087,844 | B2 * | 8/2006 | Ishimaru et al. | 174/250 |
| 2003/0197251 | A1 * | 10/2003 | Nakamura | 257/666 |
| 2004/0188857 | A1 * | 9/2004 | Ohnishi et al. | 257/778 |
| 2006/0131726 | A1 * | 6/2006 | Bruch | 257/691 |
| 2006/0131993 | A1 * | 6/2006 | Furuhata et al. | 310/313 R |
| 2007/0170601 | A1 * | 7/2007 | Miyaki et al. | 257/784 |

* cited by examiner

*Primary Examiner*—Alexander O Williams
(74) *Attorney, Agent, or Firm*—Troxell Law Office, PLLC

(57) ABSTRACT

A semiconductor device has a plurality of bumps in a same row for staggered probing. The bumps in a same row are disposed on a chip and include a plurality of regular bumps and a plurality of irregular bumps. The regular bumps and the irregular bumps are interspersed in a same pitch. Along a defined line, the widths of the irregular bumps are narrower than the ones of the regular bumps for fine pitch applications. Additionally, the irregular bumps have a plurality of integral probed portions far away the line, top surfaces of which are expanded such that probed points can be defined on the probed portions for staggered probing.

11 Claims, 3 Drawing Sheets

SEMICONDUCTOR DEVICE HAVING BUMPS IN A SAME ROW FOR STAGGERED PROBING

FIELD OF THE INVENTION

The present invention relates to a semiconductor device, and more particularly, to a semiconductor device having a plurality of bumps in a same row for staggered probing.

BACKGROUND OF THE INVENTION

Conventionally, a plurality of bumps are disposed on the surface of a semiconductor device, then flipped to an external substrate. For example, a driver IC chip having bumps is flipped and bonded to a glass substrate or a COF film. Especially, during the manufacture of the panels of STN LCD, a layer of $SiO_2$ is evaporated on the surface of the glass substrate then a layer of ITO conductive traces are patterned and formed by sputtering and photolithography. Normally the glass substrate is called ITO conductive glass. Another glass is attached to the ITO conductive glass then the gap between two glasses is filled with liquid crystals. To assemble a display panel, a plurality of driver IC chips with a plurality of bumps are needed to bond to the ITO conductive glass for driving the panel. However, the chip dimension is getting smaller and smaller, the number of bumps on chips are getting more and more. Therefore, the pitch between the bumps has to be reduced, i.e., the bump widths and bump spacing have to be reduced. Without well-controlled bump spacing, electrical shorts between bumps become a serious issue when implementing ACF or soldering for flip-chip electrical connections. With the reduced bump pitch and the minimum requirement of bump spacing, the bump width becomes smaller where the top surface of bumps available for test probing become smaller as well, which can not be probed by the probes of a probe card leading to testing failure.

As shown in FIGS. 1 and 2, a conventional semiconductor device 100 comprises a chip 110 and a plurality of bumps 120 disposed at a same row where the bumps 120 are disposed on the surface 111 of the chip 110 and are electrically connected to the bonding pads 112 thereunder. A plurality of probing points 121 for probing are defined on the top surfaces of the bumps 120 where the probing points 121 are disposed in a line. According to the processing capabilities and product specifications, when the bump spacing S1 of the same row of bumps is below 10 μm, electrical shorts and insufficient bonding strength become the major issues. When the bump widths W1 of the same row of bumps is below 15 μm, the tolerance of the defined probing points 121 becomes smaller, i.e., probes can not touch all the bumps at the same time during probing. Therefore, the bump pitch of the same row of bumps can not further be reduced.

A conventional way of solving the current issue is to dispose a row of bumps into a plurality of rows of bumps to enable staggered probing by redistribution traces done on a chip. An additional passivation layer on chip is also required. Moreover, the bonded substrate is designed to have multiple layers of traces. The chip having RDL and the multi-layer substrate are different from conventional STN flip-chip structure, an extra expensive cost is expected.

SUMMARY OF THE INVENTION

The main purpose of the present invention is to provide a semiconductor device where the bump probing pitch is greater than the bump bonding pitch by changing the shapes and the arrangement of the bumps. Therefore, bumps in a same row not only can be disposed in fine pitches but also can be probed in staggered pattern, also provide enough bonding surface to a substrate having a single layer of leads.

The second purpose of the present invention is to provide a semiconductor device to replace a multiple rows of bumps on a chip without an additional redistribution layer nor an additional passivation layer.

According to the present invention, a semiconductor device comprises a chip, a plurality of regular bumps and a plurality of irregular bumps where the chip has a surface. Defined on the surface are a first line and a second line parallel to each other. The regular bumps are formed on the surface of the chip and are disposed along the first line at a same pitch. The irregular bumps are formed on the surface of the chip where each of the irregular bumps has a narrow portion and a probed portion connected integrally. The narrow portions are disposed along the first line at the same pitch and are interspersed with the regular bumps. Moreover, the widths of the narrow portions of the irregular bumps are smaller than the ones of the regular bumps along the first line. The probed portions are disposed along the second line at the same pitch.

DETAIL DESCRIPTION OF THE INVENTION

Please refer to the attached drawings, the present invention will be described by means of embodiment(s) below.

Figure 1:
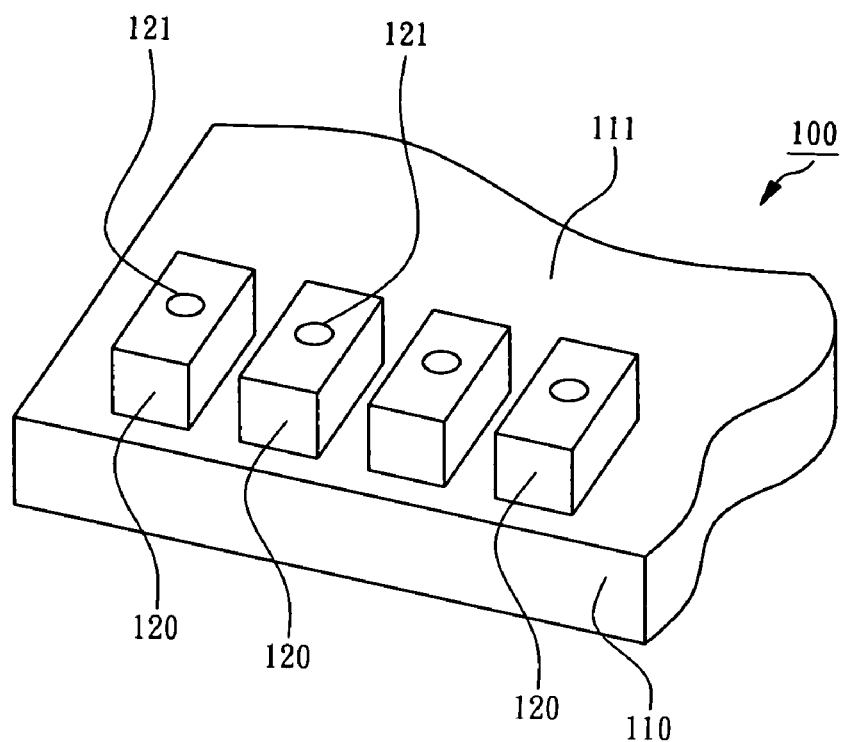
FIG. 1 shows a partial three-dimensional view of a conventional semiconductor device having a single row of bumps.
Figure 2:
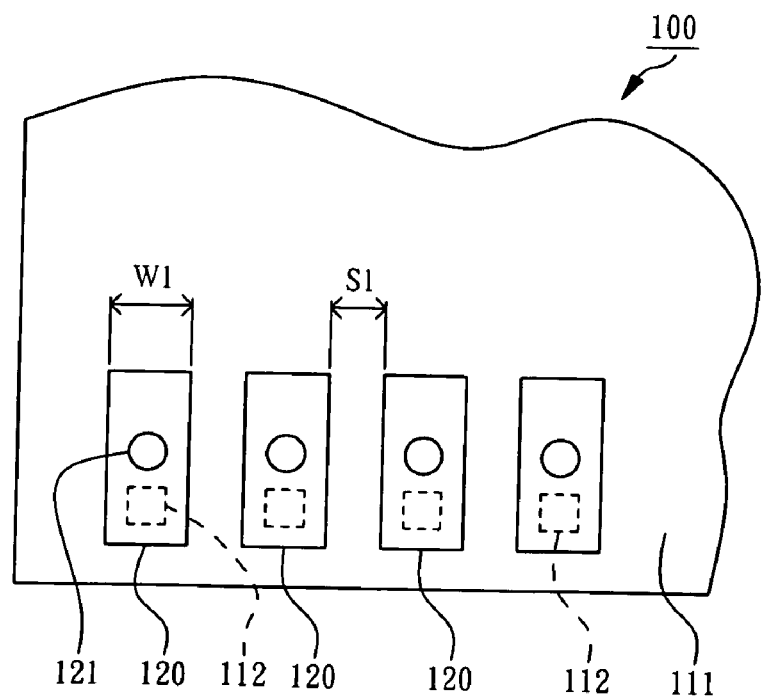
FIG. 2 shows a top view of the bumped semiconductor device.
Figure 3:
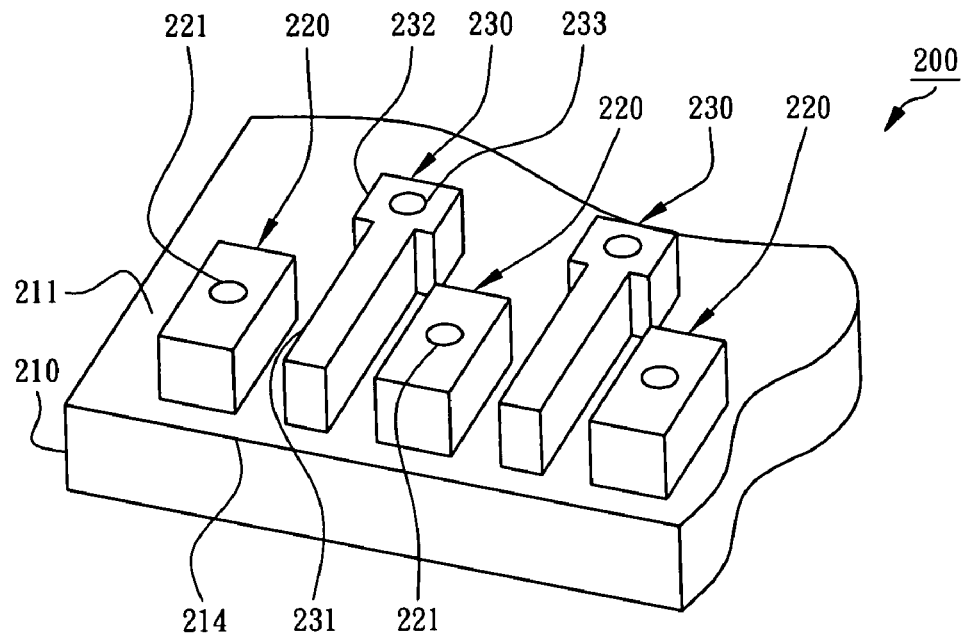
FIG. 3 shows a partial three-dimensional view of a semiconductor device according to the first embodiment of the present invention.
Figure 4:
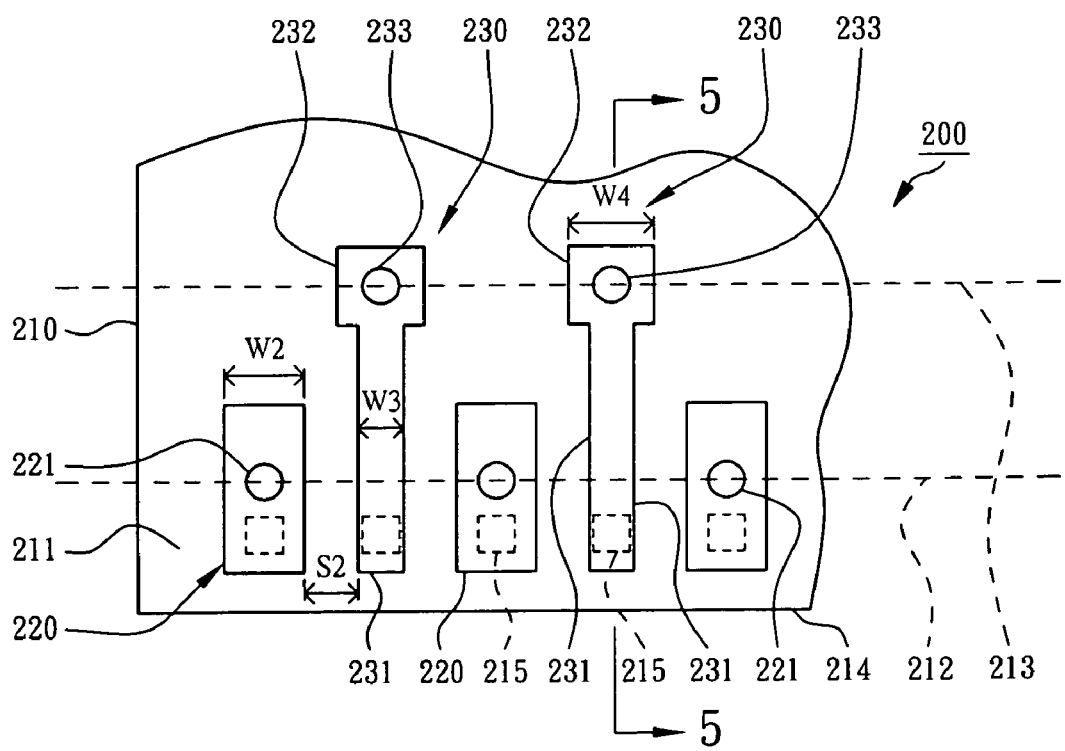
FIG. 4 shows a top view of the semiconductor device according to the first embodiment of the present invention.
Figure 5:
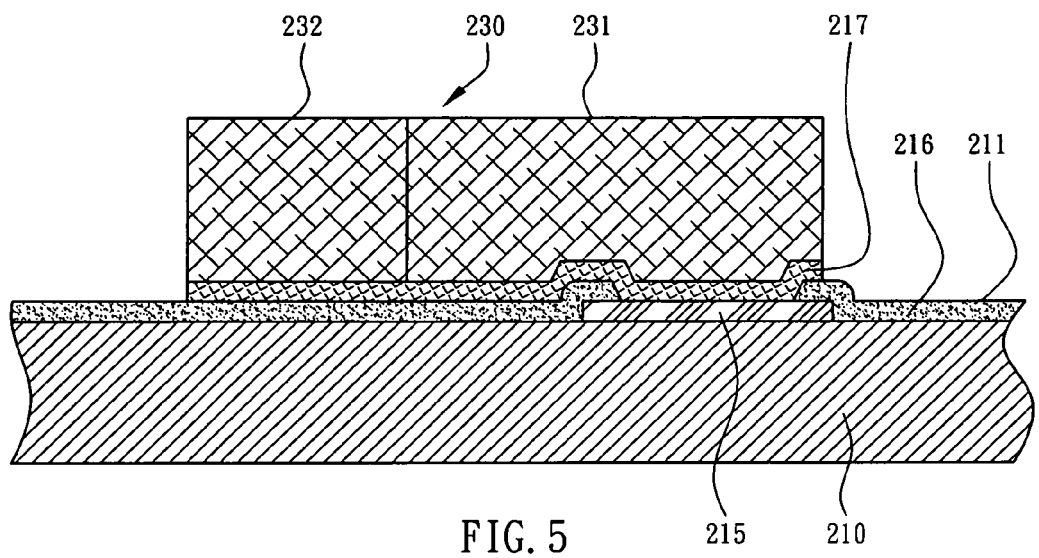
FIG. 5 shows a cross-sectional view of one of the irregular bumps of the semiconductor device according to the first embodiment of the present invention.

The first embodiment according to the present invention is illustrated with FIGS. 3, 4 and 5. As shown in FIGS. 3 and 4, a semiconductor device 200 comprises a chip 210, a plurality of regular bumps 220 and a plurality of irregular bumps 230 where the chip 210 has a surface 211. The surface 211 is an active surface of an IC chip in this embodiment. A first line 212 and a second line 213 are defined on the surface 211 and both are straight lines where the first line 212 is parallel to the second line 213. In the present embodiment, the surface 211 of the chip 210 has an edge 214 which is adjacent and parallel to the first line 212. Moreover, the distance from the edge 214 to the first line 212 are smaller than the one from the edge 214 to the second line 213, i.e., the defined first line 212 is closer to the edge 214 of the surface 211 than the second line 213. The regular bumps 220 and the irregular bumps 230, which are made of the conductive materials such as gold, copper, aluminum, are electrically connected to the plurality of bonding pads 215 of the chip 210 as the external terminals for the semiconductor device 200.

The regular bumps 220 are formed on the surface 211 of the chip 210 and are disposed along the first line 212 at a same pitch. The shapes of the regular bumps 220 may be chosen from a group consisting of rectangle, polyhedron, and cylinder. As shown in FIG. 3, the shapes of the regular bumps 220 are rectangular. A first probing point 221 is defined on the top surface of each of the regular bumps 220 for the contact point of a probe card. Before probing the semiconductor device 200, there is no probed mark on the probing point 221. But after probing, the first probing point 221 will have a probed mark.

As shown in FIGS. 3 and 4 again, the irregular bumps 230 are formed on the surface 211 of the chip 210 where each of the irregular bumps 230 has a narrow portion 231 and a probed portion 232. The narrow portions 231 are also disposed along the first line 212 at the same pitch and are interspersed with the regular bumps 220. Moreover, the width W3 of the narrow portions 231 are smaller than the width W2 of the regular bumps 220 along the first line 212. Therefore, the width of the narrow portions 231 is narrower than the one of the regular bumps 220 so that the narrow portions 231 of the irregular portions 230 and the regular bumps 220 can be disposed and interspersed along the first line 212 with high density distribution. Furthermore, the bump spacing S2 between the narrow portions 231 and adjacent the regular bumps 220 can be kept without causing shorts between the irregular bumps 230 and the regular bumps 220. Preferably, the sidewalls of the narrow portions 231 of the irregular bumps 230 are parallel to the adjacent sidewalls of the corresponding regular bumps 220 so that the bump spacing S2 can be kept constant. The probed portions 232 are integrally connected to the corresponding narrow portions 231 and are disposed along the second line 213 at the same pitch. The probed portions 232 of the irregular bumps 230 can be chosen from a group consisting of rectangle, polyhedron, and cylinder. In the present embodiment, the width W4 of the probed portions 232 along the second line 213 are greater than the width W3 of the narrow portions 231 along the first line 212. Therefore, a second probing point 233 can be defined on the top surface of the probed portion 232 of the irregular bumps 230. The first probing points 221 and the second probing points 233 are configured for achieving staggered probing with the same row of bumps. Preferably, the second probing point 233 and the adjacent first probing points 221 form the three apexes of a regular triangle. The probes of the probe cards are also arranged in the corresponding staggered arrangement with equal pitch to reduce the complication of manufacturing a probe card.

Preferably, as shown in FIG. 4, the total area of the top surface of each of the irregular bumps 230, including the narrow portion 231 and the probed portion 232, is equal to the one of each of the regular bumps 220. Therefore, when the regular bumps 220 and the irregular bumps 230 bonding to a substrate with a single layer of leads, the bonding strength between the irregular bumps 230 and the corresponding leads is about the same as the bonding strength between the regular bumps 220 and the corresponding leads. Furthermore, in the present embodiment, as shown in FIG. 5, a layer of UBM (Under Bump Metallurgy) pads 217 are disposed under the irregular bumps 230 where part of each of the UBM pads 217 under the narrow portions 231 is formed on the passivation layer 216 of the chip 210 and directly electrically connect to the corresponding bonding pad 215 to eliminate the extra redistribution layer and an extra passivation layer on top of the passivation layer 216 of the chip 210.

Figure 6:
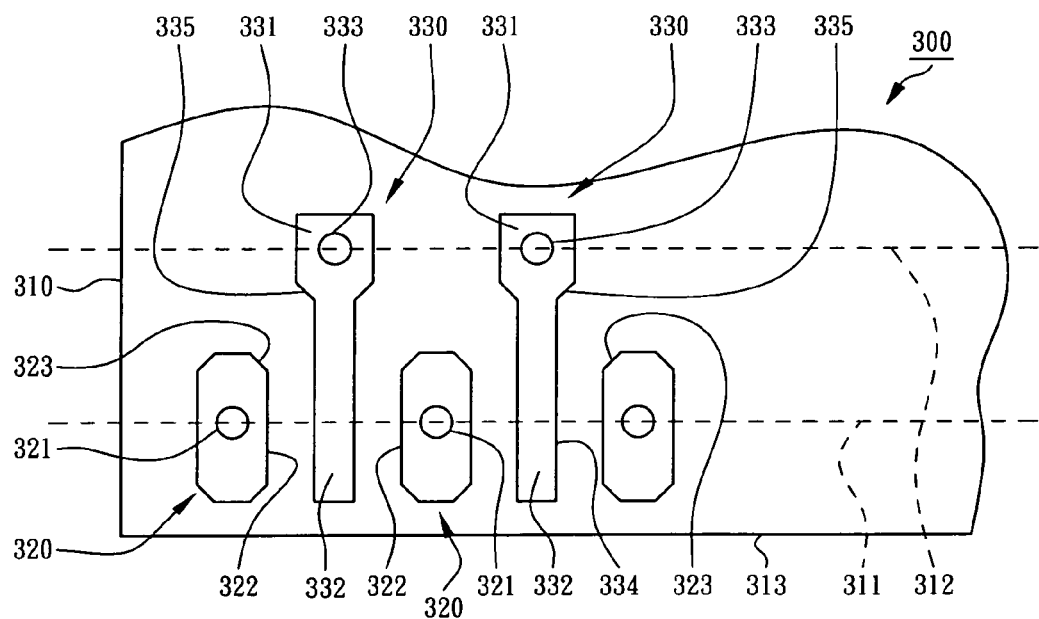
FIG. 6 shows a top view of a semiconductor device according to the second embodiment of the present invention.

In the second embodiment of the present invention, as shown in FIG. 6, a semiconductor device 300 comprises a chip 310, a plurality of regular bumps 320, and a plurality of irregular bumps 330 where a first line 311 and a second line 312 are defined on the surface of the chip 310. The first line 311 and the second line 312 are parallel to each other where the first line 311 is adjacent to an edge 313 of active surface of the chip 310. The regular bumps 320 are formed on the surface of the chip 310 and are disposed along the first line 311 at a same pitch. The irregular bumps 330 are also formed on the surface of the chip 310, each of which has a narrow portion 332 and a probed portion 333. The narrow portions 332 are also disposed along the first line 311 at the same pitch and are interspersed with the regular bumps 320. Moreover, the width of each of the narrow portions 322 along the first line 311 is smaller than the one of each of the regular bumps 320 along the first line 311 to avoid bump short. The probed portions 331 are integrally connected to the corresponding narrow portions 332 and are disposed along the second line 312 at the same pitch. A second probing point 333 can be defined on the top surface of the probed portions 331 since the probed portions 331 are wider than the narrow portions 322. Along with the corresponding first probing point 321 defined on the top surface of the regular bumps 320, staggered probing with a same row of high density bumps can be implemented in the semiconductor device 300. More detailed to say, the sidewalls 322 of the regular bumps 320 are parallel to the sidewalls 334 of the narrow portions 332 of the irregular bumps 330. Preferably, each of the regular bumps 320 has a first chamfered side 323, and each of the probed portions 331 of the irregular bumps 330 has a second chamfered side 335 wherein the first chamfered side 323 are parallel to the adjacent second chamfered side 335 to further eliminate electrical shorts and improve encapsulation flowing.

The above description of embodiments of this invention is intended to be illustrative and not limiting. Other embodiments of this invention will be obvious to those skilled in the art in view of the above disclosure.

What is claimed is:

1. A semiconductor device comprising:
   a chip having a surface where a first line and a second line are defined on the surface and parallel to each other;
   a plurality of regular bumps formed on the surface of the chip and disposed along the first line at a same pitch;
   a plurality of irregular bumps formed on the surface of the chip, wherein each of the irregular bumps has a narrow portion and a probed portion, wherein the narrow portions are disposed along the first line at the same pitch and are interspersed with the regular bumps, wherein the width of the narrow portions is smaller than the width of the regular bumps along the first line, wherein the probed portions integrally connected with the corresponding narrow portions are disposed along the second line at the same pitch; and
   a plurality of bonding pads located on the surface of the chip and positioned parallel to the first line and between the first line and an edge of the chip, the edge of the chip is parallel to the first line and the second line, the narrow portion of each of the plurality of irregular bumps is located above a corresponding one of the plurality of bonding pads, the probed portion of each of the plurality of irregular bumps is spaced apart from the corresponding one of the plurality of bonding pads,
   wherein each of the plurality of regular bumps and the plurality of irregular bumps protrude outwardly from the surface of the chip.

2. The semiconductor device of claim 1, wherein the shape of the regular bumps is chosen from a group consisting of rectangle, polyhedron, and cylinder.

3. The semiconductor device of claim 1, wherein the width of the probed portions along the second line is greater than the width of the narrow portions along the first line.

4. The semiconductor device of claim 3, wherein the shape of the probed portions of the irregular bumps is chosen from a group consisting of rectangle, polyhedron, and cylinder.

5. The semiconductor device of claim 3, wherein the total area of the top surface of each of the irregular bumps, including its narrow portion and probed portion, is almost equal to the total area of a top surface of each of the regular bumps.

6. The semiconductor device of claim 3, wherein a sidewall of the narrow portion of each of the irregular bumps is parallel to a sidewall of an adjacent one of the regular bumps.

7. The semiconductor device of claim 6, wherein each of the regular bumps has a first chamfered side and each of the irregular bumps has a second chamfered side, wherein the first chamfered side is parallel to the adjacent second chamfered side.

8. The semiconductor device of claim 3, wherein each of the regular bumps defines a first probing point thereon, each of the irregular bumps defines a second probing point on the top surface of corresponding probed portion, wherein the second probing point and the two adjacent corresponding first probing points form three apexes of a regular triangle.

9. The semiconductor device of claim 1, wherein the surface of the chip has an edge adjacent and parallel to the first line, and wherein the distance from the edge to the first line is smaller than the one from the edge to the second line.

10. The semiconductor device of claim 1, further comprising a plurality of UBM pads disposed under the regular bumps and the irregular bumps, wherein the portions of the UBM pads under the narrow portions are formed on a passivation layer of the chip and electrically connect to the corresponding bonding pads of the chip.

11. The semiconductor device of claim 10, wherein some of the UBM pads under the irregular bumps are in T-shape.

* * * * *